(12) United States Patent
Li et al.

(10) Patent No.: US 9,048,870 B2
(45) Date of Patent: Jun. 2, 2015

(54) LOW DENSITY PARITY CHECK DECODER WITH FLEXIBLE SATURATION

(71) Applicant: LSI Corporation, San Jose, CA (US)

(72) Inventors: Shu Li, Milpitas, CA (US); Zongwang Li, San Jose, CA (US); Shaohua Yang, San Jose, CA (US); Fan Zhang, Milpitas, CA (US)

(73) Assignee: LSI Corporation, San Jose, CA (US)

(*) Notice: Subject to any disclaimer, the term of this patent is extended or adjusted under 35 U.S.C. 154(b) by 181 days.

(21) Appl. No.: 13/777,976

(22) Filed: Feb. 26, 2013

(65) Prior Publication Data

US 2014/0143628 A1    May 22, 2014

Related U.S. Application Data

(60) Provisional application No. 61/728,060, filed on Nov. 19, 2012.

(51) Int. Cl.
*H03M 13/00* (2006.01)
*H03M 13/11* (2006.01)
*H03M 13/37* (2006.01)

(52) U.S. Cl.
CPC ...... *H03M 13/1117* (2013.01); *H03M 13/1125* (2013.01); *H03M 13/114* (2013.01); *H03M 13/1171* (2013.01); *H03M 13/3723* (2013.01); *H03M 13/6331* (2013.01); *H03M 13/6343* (2013.01); *H03M 13/6508* (2013.01); *H03M 13/6591* (2013.01)

(58) Field of Classification Search
CPC ............... H03M 13/1117; H03M 13/1125; H03M 13/114; H03M 13/1171; H03M 13/3723; H03M 13/6343; H03M 13/6508; H03M 13/6591

USPC .......................................... 714/752, 755, 758
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |

(Continued)

OTHER PUBLICATIONS

Varnica et al. Belief Propagation with Information Correction: near maximum likelihood decoding of LDPC codes, Mar. 2004, Harvard university, sildes 1-27.*

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

(Continued)

*Primary Examiner* — Sam Rizk
(74) *Attorney, Agent, or Firm* — Hamilton DeSanctis & Cha

(57) ABSTRACT

Embodiments of the present inventions are related to systems and methods for decoding data in an LDPC decoder with flexible saturation levels for variable node probability values.

20 Claims, 5 Drawing Sheets

(56) References Cited

U.S. PATENT DOCUMENTS

| | | | |
|---|---|---|---|
| 5,978,414 | A | 11/1999 | Nara |
| 5,983,383 | A | 11/1999 | Wolf |
| 6,005,897 | A | 12/1999 | McCallister |
| 6,023,783 | A | 2/2000 | Divsalar |
| 6,029,264 | A | 2/2000 | Kobayashi |
| 6,065,149 | A | 5/2000 | Yamanaka |
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,113,356 | B1 | 9/2006 | Wu |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,752,523 | B1 | 7/2010 | Chaichanavong |
| 7,779,325 | B2 | 8/2010 | Song |
| 7,802,172 | B2 | 9/2010 | Vila Casado et al. |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 2006/0256670 | A1 | 11/2006 | Park |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2011/0164669 | A1 | 7/2011 | Mathew |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fair et al., "Guided scrambling: a new line coding technique for high bit rate fiber optic transmission systems", IEEE Trans. Commun., vol. 39, pp. 289-297 (Feb. 1991).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Jin et al., "Design Techniques for Weakly Constrained Codes", IEEE Trans Commun. vol. 51, No. 5, pp. 709-714 (May 2003).

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsŝi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/227,416, filed Sep. 7, 2011 (Lei Chen), Unpublished.

U.S. Appl. No. 13/302,119, filed Nov. 22, 2011 (Lei Chen), Unpublished.

U.S. Appl. No. 13/602,535, filed Sep. 4, 2012 (Fan Zhang), Unpublished.

U.S. Appl. No. 13/269,852, filed Oct. 10, 2011 (Haitao Xia), Unpublished.

U.S. Appl. No. 13/284,767, filed Oct. 28, 2011 (Fan Zhang), Unpublished.

U.S. Appl. No. 13/269,832, filed Oct. 10, 2011 (Haitao Xia), Unpublished.

U.S. Appl. No. 13/227,544, filed Sep. 8, 2011 (Shaohua Yang), Unpublished.

U.S. Appl. No. 13/239,683, filed Sep. 22, 2011 (Changyou Xu), Unpublished.

(56) References Cited

OTHER PUBLICATIONS

U.S. Appl. No. 13/186,234, filed Jul. 19, 2011 (Haitao Xia), Unpublished.
U.S. Appl. No. 13/283,549, filed Oct. 27, 2011 (Wu Chang), Unpublished.
U.S. Appl. No. 13/305,551, filed Nov. 28, 2011 (Yang Han), Unpublished.
U.S. Appl. No. 13/296,022, filed Nov. 14, 2011 (Victor Krachkovsky), Unpublished.
U.S. Appl. No. 13/174,537, filed Jun. 30, 2011 (Anantha Raman Krishnan), Unpublished.
U.S. Appl. No. 13/180,495, filed Jul. 11, 2011 (Chung-Li Wang), Unpublished.
U.S. Appl. No. 13/174,453, filed Jun. 30, 2011 (Johnson Yen), Unpublished.
U.S. Appl. No. 13/171,615, filed Jun. 29, 2011 (Bradley D. Seago), Unpublished.
U.S. Appl. No. 13/113,219, filed May 23, 2011 (Yang Han), Unpublished.
U.S. Appl. No. 13/300,078, filed Nov. 18, 2011 (Chung-Li Wang), Unpublished.
U.S. Appl. No. 13/213,751, filed Aug. 19, 2011 (Fan Zhang), Unpublished.
U.S. Appl. No. 13/619,907, filed Sep. 14, 2012 (Fan Zhang), Unpublished.
U.S. Appl. No. 13/552,403, filed Jul. 18, 2012 (Fan Zhang), Unpublished.
U.S. Appl. No. 13/558,245, filed Jul. 25, 2012 (Fan Zhang), Unpublished.
U.S. Appl. No. 13/295,150, filed Nov. 14, 2011 (Zongwang Li), Unpublished.
U.S. Appl. No. 13/363,751, filed Feb. 1, 2012 (Lei Chen), Unpublished.
U.S. Appl. No. 13/284,730, filed Oct. 28, 2011 (Fan Zhang), Unpublished.
U.S. Appl. No. 13/545,833, filed Jul. 10, 2012 (Zhi Bin Li), Unpublished.
U.S. Appl. No. 13/596,819, filed Aug. 28, 2012 (Shaohua Yang), Unpublished.
U.S. Appl. No. 13/596,947, filed Aug. 28, 2012 (Fan Zhang), Unpublished.
U.S. Appl. No. 13/560,702, filed Jul. 27, 2012 (Fan Zhang), Unpublished.
U.S. Appl. No. 13/597,001, filed Aug. 28, 2012 (Fan Zhang), Unpublished.
U.S. Appl. No. 13/561,230, filed Jul. 30, 2012 (Fan Zhang), Unpublished.
U.S. Appl. No. 13/621,341, filed Sep. 17, 2012 (Shaohua Yang), Unpublished.
U.S. Appl. No. 13/597,026, filed Aug. 28, 2012 (Fan Zhang), Unpublished.
U.S. Appl. No. 13/989,583, filed Oct. 15, 2012 (Shaohua Yang), Unpublished.
U.S. Appl. No. 13/622,294, filed Sep. 18, 2012 (Fan Zhang), Unpublished.
U.S. Appl. No. 13/670,393, filed Nov. 6, 2012 (Lei Chen), Unpublished.
U.S. Appl. No. 13/741,003, filed Jan. 14, 2013 (Lu Lu), Unpublished.
U.S. Appl. No. 13/742,336, filed Jan. 15, 2013 (Jianzhong Huang), Unpublished.
U.S. Appl. No. 13/742,340, filed Jan. 15, 2013 (Razmik Karabed), Unpublished.
U.S. Appl. No. 13/602,463, filed Sep. 4, 2012 (Fan Zhang), Unpublished.
U.S. Appl. No. 13/596,978, filed Aug. 28, 2012 (Fan Zhang), Unpublished.
U.S. Appl. No. 13/340,951, filed Dec. 30, 2011 (Lei Chen), Unpublished.
U.S. Appl. No. 13/316,953, filed Dec. 12, 2011 (Haitao Xia), Unpublished.
U.S. Appl. No. 13/412,520, filed Mar. 5, 2012 (Fan Zhang), Unpublished.
U.S. Appl. No. 13/426,714, filed Mar. 22, 2012 (Shaohua Yang), Unpublished.
U.S. Appl. No. 13/445,834, filed Apr. 12, 2012 (Chung-Li Wang), Unpublished.
U.S. Appl. No. 13/362,409, filed Jan. 31, 2012 (Fan Zhang), Unpublished.
U.S. Appl. No. 13/474,660, filed May 17, 2012 (Zongwang Li), Unpublished.
U.S. Appl. No. 13/316,858, filed Dec. 12, 2011 (Zongwang Li), Unpublished.
U.S. Appl. No. 13/316,741, filed Dec. 12, 2011 (Yang Han), Unpublished.
U.S. Appl. No. 13/445,848, filed Apr. 12, 2012 (Bruce Wilson), Unpublished.
U.S. Appl. No. 13/340,974, filed Dec. 30, 2011 (Dan Liu), Unpublished.
U.S. Appl. No. 13/372,580, filed Feb. 14, 2012 (Fan Zhang), Unpublished.
U.S. Appl. No. 13/369,468, filed Feb. 9, 2012 (Zongwang Li), Unpublished.
U.S. Appl. No. 13/251,342, filed Oct. 3, 2011 (Haitao Xia), Unpublished.
U.S. Appl. No. 13/422,986, filed Mar. 16, 2012 (Fan Zhang), Unpublished.
U.S. Appl. No. 13/433,693, filed Mar. 29, 2012 (Fan Zhang), Unpublished.
U.S. Appl. No. 13/342,240, filed Jan. 3, 2012 (Shaohua Yang), Unpublished.
U.S. Appl. No. 138433,742, filed Mar. 29, 2012 (Fan Zhang), Unpublished.
U.S. Appl. No. 13/400,750, filed Feb. 21, 2012 (Fan Zhang), Unpublished.
U.S. Appl. No. 13/305,510, filed Nov. 28, 2011 (Lei Chen), Unpublished.
U.S. Appl. No. 13/445,878, filed Apr. 12, 2012 (Yu Liao), Unpublished.
U.S. Appl. No. 13/327,279, filed Dec. 15, 2011 (Wei Feng), Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

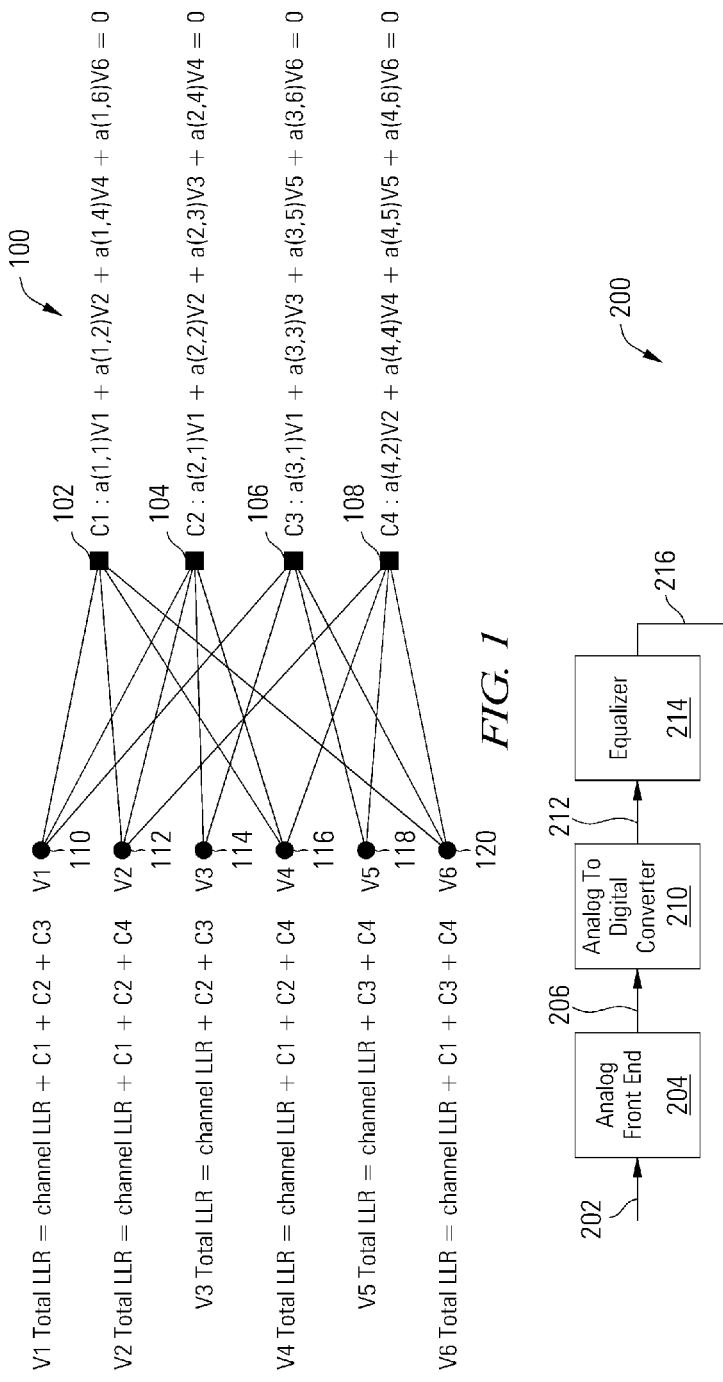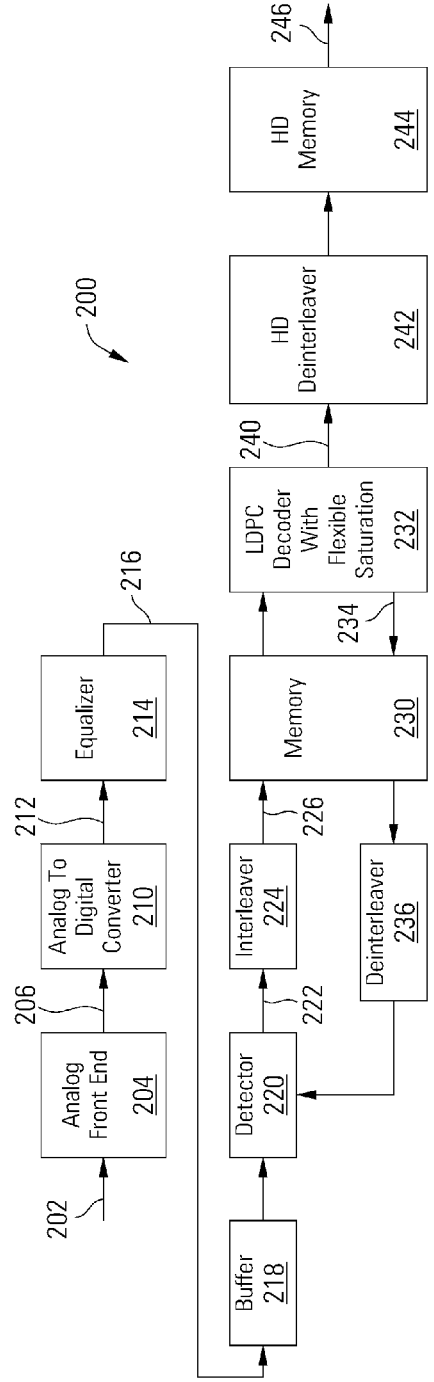
FIG. 1
FIG. 2

LOW DENSITY PARITY CHECK DECODER WITH FLEXIBLE SATURATION

CROSS REFERENCE TO RELATED APPLICATIONS

The present application claims priority to (is a non-provisional of) U.S. Pat. App. No. 61/728,060, entitled "Low Density Parity Check Decoder With Flexible Saturation", and filed Nov. 19, 2012 by Li et al, the entirety of which is incorporated herein by reference for all purposes.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in Low Density Parity Check (LDPC) decoders, including LDPC decoders for regular and irregular LDPC codes. A regular LDPC code is one with a constant row weight and a constant column weight, that is, the same number of non-zero entries in each column of the H matrix for the LDPC code, and the same number of non-zero entries in each row of the H matrix. An irregular LDPC code, in contrast, can have non-uniform weights, that is, different column weights and different row weights. An irregular LDPC code balances the competing needs for variable nodes to have a large weight (many input connections) to quickly converge to the correct values versus check nodes with small weight (fewer input connections) to improve LDPC code performance. The non-uniform weights of an irregular LDPC code enable the variable nodes with larger weight to quickly converge to the correct values, which increases message quality to the check nodes, then helping lower weight variable nodes to converge. As a result, irregular LDPC codes can have better waterfall performance than regular LDPC codes. However, because the variable nodes with smaller column weight have fewer connected check nodes, they have less feedback and can be slower to correct errors, inhibiting convergence on correct values in the low column weight variable nodes.

BRIEF SUMMARY

Embodiments of the present inventions are related to systems and methods for decoding data in an LDPC decoder with flexible saturation levels for variable node log likelihood ratio (LLR) values. When decoding a codeword in an LDPC decoder, the total LLR values are limited for suspicious variable nodes, those that are likely to contain errors. In some embodiments, the total LLR limit is applied to variable nodes with relatively low column weights in an irregular non-binary LDPC decoder. When updating the total LLR values for suspicious low column weight variable nodes, if the calculated total LLR value exceeds a saturation level, the total LLR value is limited to the saturation level. The saturation level may be varied based on the global iteration index number. In some embodiments, the saturation level is decreased as the global iteration index number increases.

This summary provides only a general outline of some embodiments according to the present invention. Many other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 depicts a Tanner graph of a simplified LDPC code that may be decoded in an LDPC decoder with flexible saturation in accordance with some embodiments of the present inventions;

FIG. 2 depicts a block diagram of a read channel with an LDPC decoder with flexible saturation which may be used to retrieve or receive stored or transmitted data in accordance with some embodiments of the present inventions;

DETAILED DESCRIPTION OF THE INVENTION

Figure 3:
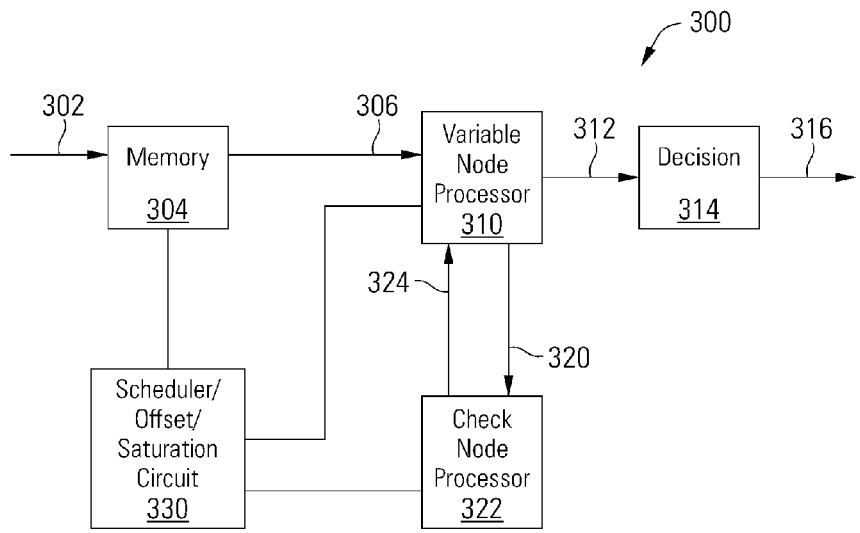
FIG. 3 depicts a block diagram of a multi-level LDPC decoder with flexible saturation in accordance with some embodiments of the present inventions.

Embodiments of the present inventions are related to LDPC decoders with flexible saturation levels for variable node values. During decoding in an LDPC decoder with flexible saturation levels, the maximum or saturation level of a total log likelihood ratio (LLR) value is flexibly adjusted to facilitate convergence. In other embodiments, a total plain-likelihood probability value is used as an equivalent to a total LLR value, and in these embodiments, the saturation level of the total plain-likelihood probability value is flexibly adjusted to facilitate convergence. In irregular LDPC decoder embodiments in which some variable nodes have fewer connected check nodes than others, the saturation level is reduced for the lower column weight variable nodes. This helps prevent an erroneous value in such a variable node from resisting correction due to the lower amount of feedback from connected check nodes. In some embodiments, the saturation level adjustment is applied only to suspicious variable nodes, which are marked as those variable nodes that fail parity checks in one or more connected check nodes. In some embodiments, variable node value offsetting is disabled for those variable nodes to which flexible saturation is applied.

The LDPC decoder with flexible saturation may be, but is not limited to, a multi-level (non-binary) decoder, and may be a layer or non-layer decoder for regular or irregular LDPC codes. LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120. The connections (or edges) between variable nodes 110-120 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-120 and check nodes 102-108 in an iterative process, passing beliefs about the values that should appear in variable nodes 110-120 to connected check nodes 102-108. Parity checks are performed in the check nodes 102-108 based on the messages and the results are returned to connected variable nodes 110-120 to update the beliefs if necessary. In a non-binary LDPC decoder, variable nodes 110-120 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors. Embodiments of the LDPC decoder with flexible saturation disclosed herein limit total LLR values for symbols in variable nodes to saturation levels for selected variable nodes to facilitate convergence. In other embodiments, messages are passed using plain-likelihood probability vectors, with the plain likelihood probabilities limited to saturation levels for selected variable nodes to facilitate convergence.

The connections between variable nodes 110-120 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & a(1,2) & 0 & a(1,4) & 0 & a(1,6) \\ a(2,1) & a(2,2) & a(2,3) & a(2,4) & 0 & 0 \\ a(3,1) & 0 & a(3,3) & 0 & a(3,5) & a(3,6) \\ 0 & a(4,2) & 0 & a(4,4) & a(4,5) & a(4,6) \end{bmatrix}$$

The H matrix above is the parity check matrix for a simple irregular LDPC code, including both weight-2 and weight 3 columns. Notably, the LDPC decoder with flexible saturation is not limited to any particular column weights. In the H matrix above, columns 1, 2, 4 and 6 are weight-3 columns, meaning that the variable nodes corresponding to columns 1, 2, 4 and 6 are each connected to three check nodes. Columns 3 and 5 are weight-2 columns, meaning that the variable nodes corresponding to columns 3 and 5 are each connected to two check nodes. Each non-zero value in the H matrix is a non-zero value on GF(q), which may have a value from 1 to q−1.

By providing multiple check nodes 102-108 for the group of variable nodes 110-120, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 112, 116, and 120. Values are passed back and forth between connected variable nodes 110-120 and check nodes 102-108 in an iterative process until the LDPC code converges on a value for the group of data and parity bits in the variable nodes 110-120. For example, the value of variable node 110 is calculated based on the channel LLR value and messages from check nodes 102, 104 and 106, and variable node 110 passes messages to check nodes 102, 104 and 106. Check node 102 passes messages back to variable nodes 110, 112, 116 and 120. The messages between variable nodes 110-120 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-120 and check nodes 102-108, with the values in the nodes 102-120 being adjusted based on the messages that are passed, until the values converge and stop changing or until processing is halted.

The LDPC decoder used in various embodiments may implement any suitable decoding algorithm. Check nodes in an LDPC decoder receive incoming messages from connected or neighboring variable nodes and generate outgoing messages to each neighboring variable node to implement the parity check matrix for the LDPC code. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message with for each neighboring variable node.

In some embodiments, the LDPC decoder performs min-sum based decoding of LDPC codes. Min-sum based decoding may be performed by initializing the LLR value of each variable node $v_n$ at iteration k=1 to $L_n^0 = L_{nm}^0$. The check nodes $c_m$ are updated using the min-sum approximation of Equation 1:

$$L_{mn,MS}^k = \left(\prod_{n' \in B(m)\setminus n} \text{sign}(L_{n'm}^{k-1})\right) \cdot \min_{n' \in B(m)\setminus n} |L_{n'm}^{k-1}| \quad (\text{Eq 1})$$

The k-th output of variable node $v_n$ is calculated according to Equation 2:

$$L_n^k = L_n^0 + \sum_{m \in A(n)} L_{mn}^k \quad (\text{Eq 2})$$

The variable node $v_n$ is updated according to Equation 3:

$$L_{nm}^k = L_n^k - L_{mn}^k \quad (\text{Eq 3})$$

The iteration index k is incremented and the iterative process continues by updating check nodes $c_m$ using the min-sum approximation of Equation 1. Thus, the feedback soft information from check nodes to variable nodes is added onto the variable node's soft information to generate the updated hard decision and soft information for generating variable node to check node messages. Any suitable min-sum based LDPC decoder may be used to implement the flexible saturation disclosed herein. Based upon the disclosure provided herein, one of ordinary skill in the art will recognize a variety of min-sum based LDPC decoders that may be used in relation to different embodiments of the present inventions.

In other embodiments, the LDPC decoder with flexible saturation performs simplified min-sum decoding, in which the check nodes calculate the minimum sub-message $\min_1(d)$, the index $\text{idx}(d)$ of $\min_1(d)$, and the sub-minimum or next minimum sub-message $\min_2(d)$, or minimum of all sub-messages excluding $\min_1(d)$, for each nonzero symbol d in the Galois Field based on all extrinsic V2C messages from neighboring variable nodes. In other words, the sub-messages for a particular symbol d are gathered from messages from all extrinsic inputs, and the $\min_1(d)$, $\text{idx}(d)$ and $\min_2(d)$ are calculated based on the gathered sub-messages for that symbol d. For a Galois Field with q symbols, the check node will calculate the $\min_1(d)$, $\text{idx}(d)$ and $\min_2(d)$ sub-message for each of the q−1 non-zero symbols in the field except the most likely symbol. The $\min_1(d)$, $\text{idx}(d)$ and $\min_2(d)$ values are stored in a memory for use in calculating the C2V message, requiring much less memory than the traditional non-binary LDPC check node processor that stores each intermediate forward and backward message. An example of the simplified min-sum decoding is provided for a multi-level non-layer LDPC decoder in U.S. patent application Ser. No. 13/180,495 filed on Jul. 11, 2011 for a "Min-Sum Based Non-Binary LDPC Decoder", which is incorporated by reference herein for all purposes.

Although the LDPC decoder with flexible saturation is not limited to any particular application, several examples of applications are presented herein that benefit from embodiments of the present inventions. Turning to FIG. 2, a read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In some of these embodiments, the detected output 222 contains log-likelihood-ratio (LLR) soft information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is provided to an interleaver 224 that protects data against burst errors. Burst errors overwrite localized groups or bunches of bits. Because LDPC decoders are best suited to correcting errors that are more uniformly distributed, burst errors can overwhelm LDPC decoders. The interleaver 224 prevents this by interleaving or shuffling the detected output 222 from data detector 220 to yield an interleaved output 226 which is stored in a memory 230. The interleaved output 226 from the memory 230 is provided to an LDPC decoder with flexible saturation 232 which performs parity checks on the interleaved output 226, ensuring that parity constraints established by an LDPC encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the LDPC decoder 232.) To perform a global iteration, LLR values 234 from the LDPC decoder 232 are stored in memory 230, deinterleaved in a deinterleaver 236 to reverse the process applied by interleaver 224, and provided again to the data detector 220 to allow the data detector 220 to repeat the data detection process, aided by the LLR values 234 from the LDPC decoder 232. In this manner, the read channel 200 can perform multiple global iterations, allowing the data detector 220 and LDPC decoder 232 to converge on the correct data values.

The LDPC decoder 232 also produces hard decisions 240 about the values of the data bits or symbols contained in the interleaved output 226 of the interleaver 224. For binary data bits, the hard decisions may be represented as 0's and 1's. In a GF(4) LDPC decoder, the hard decisions may be represented by four field elements 00, 01, 10 and 11.

The hard decisions 240 from LDPC decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

Turning to FIG. 3, a block diagram of an LDPC decoder with flexible saturation 300 is depicted in accordance with some embodiments of the present inventions. The LDPC decoder with flexible saturation 300 may be a binary or multi-level decoder, layered or non-layered, regular or irregular, and is not limited to any particular algorithm for parity check calculations or message generation techniques. Input data 302 is stored in a memory 304. Input data 302 includes soft values representing variable node value probabilities in some embodiments. Probability values 306 from memory 304 are provided to a variable node processor 310, which generates V2C messages 320 containing probability values for the perceived value of each bit or symbol. A check node processor 322 receives the V2C messages 320 and performs parity check calculations for each check node based on messages from connected variable nodes. The check node processor 322 also generates C2V messages 324, enabling the variable node processor 310 to update the perceived value for each variable node based on C2V messages 324 from connected check nodes. In a min-sum based LDPC decoder, the check node processor 322 selects the lowest (or minimum) LLR values and feeds them back to the connected variable nodes with sign adjustment. Updated variable node values may also be updated in the memory 304 during local decoding iterations, either by the variable node processor 310 or check node processor 322 or both. Probability values 312 from the variable node processor 310 may also be provided to a decision circuit 314 which generates a hard decision output 316.

A scheduler and offset/saturation circuit 330 in the LDPC decoder 300 controls the processing of the H matrix in the LDPC decoder 300, such as, but not limited to, controlling the order of C2V and V2C message generation, parity checks and variable node updates. The scheduler and offset/saturation circuit 330 also applies flexible saturation, limiting the LLR values in suspicious variable nodes. By saturating or limiting the LLR values to maximum levels, the scheduler and offset/saturation circuit 330 prevents the variable node values from reaching higher levels which could hinder correction of erroneous values. This is particularly beneficial for low column weight variable nodes, for which the fewer connected check nodes provide less feedback than higher column weight variable nodes receive, because error correction is slower with less feedback.

The scheduler and offset/saturation circuit 330 may also determine which variable nodes receive flexible saturation by identifying suspicious variable nodes, that is, variable nodes with relatively low column weights for which connected check nodes have failed parity checks for a certain number of iterations. In some embodiments with weight-2 and weight-3 columns in the H matrix, the scheduler and offset/saturation circuit 330 marks weight-2 variable nodes that have failing parity checks for a certain number of iterations as suspicious variable nodes. During decoding, the scheduler and offset/saturation circuit 330 checks the total LLR values of the suspicious variable nodes after the variable node updates are performed, and resets the total LLR values to the saturation level for any total LLR values that exceed the saturation level. Notably, the saturation levels for individual variable nodes may be different, and these saturation levels are adapted on the fly for specific variable nodes.

In a min-sum based LDPC decoder, the C2V messages from each check node specify the minimum LLR values with the sign flipped or inverted. When a variable node has an erroneous value, the total LLR value for the variable node needs to be turned around by the incoming C2V messages to change the current decision and correct the error. If a relatively high column weight variable node has an erroneous value, even with a high LLR value for that erroneous value, the inverted sign messages from the relatively high number of connected check nodes can combine to override and correct the erroneous value. However, for an erroneous value in a relatively low column weight variable node, if that erroneous value has a high LLR value, the smaller number of connected check nodes will not be as capable of combining to correct the erroneous value. By applying flexible saturation, suspicious variable nodes with low column weights are prevented from reaching high LLR values that would hinder correction and convergence.

The scheduler and offset/saturation circuit 330 also controls variable node offsetting, in which offsets are added to the variable node values or to V2C messages to facilitate convergence. In some embodiments, the scheduler and offset/saturation circuit 330 disables offsetting in variable nodes for which flexible saturation is applied.

Figure 4:
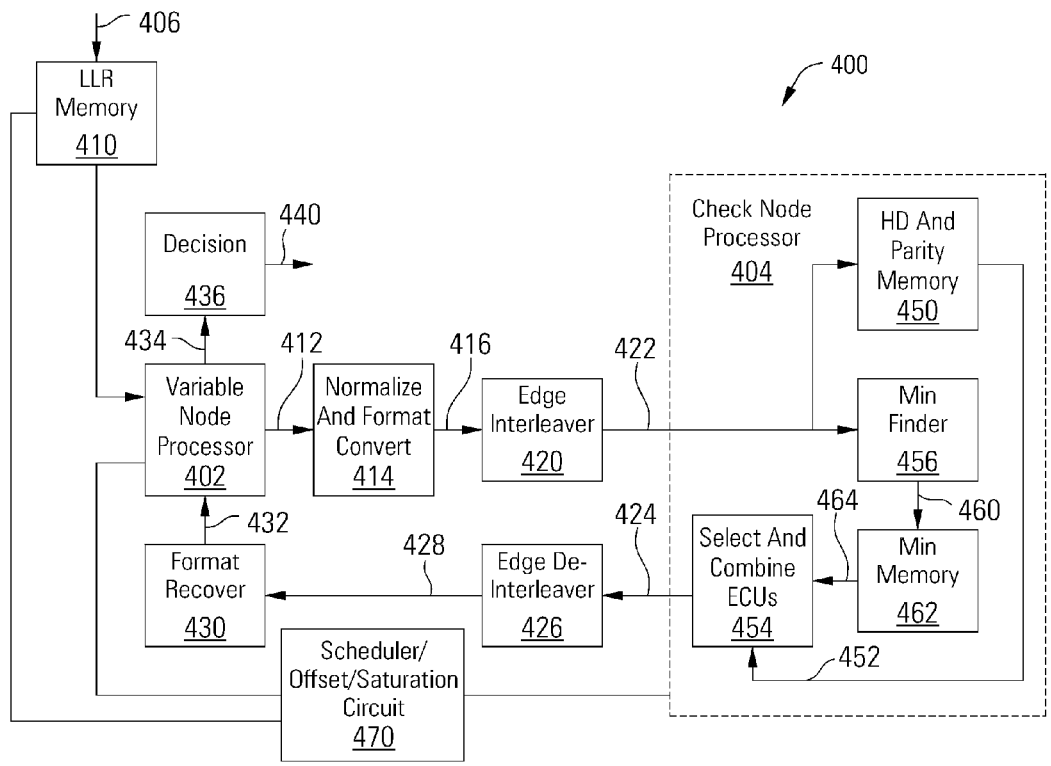
FIG. 4 depicts a block diagram of a multi-level min-sum based LDPC decoder with flexible saturation in accordance with some embodiments of the present inventions.

Turning to FIG. 4, in some embodiments, the LDPC decoder with flexible saturation is a min-sum based non-binary irregular LDPC decoder 400 in which check nodes calculate a minimum, next minimum and hard decision value based on incoming V2C message vectors.

The LDPC decoder 400 is provided with an input 406, for example containing a hard decision and corresponding LLR values, which are stored in a symbol memory 410. The input 406 is provided to the variable node processor 402 from the symbol memory 410, and the variable node processor 402 updates the perceived value of each symbol based on the value from input 406 and on C2V message vectors or check node messages from a check node processor 404. The variable node processor 402 also generates V2C message vectors 412 or variable node messages for neighboring check nodes.

In various embodiments of LDPC decoders with flexible saturation, the variable node processor 402 and check node processor 404 may each be unitary, discrete components, or their functions may be distributed and intermixed in multiple components. The terms variable node processor and check node processor are therefore not limited to two discrete processing components, but apply generally to any components or combinations of components in an LDPC decoder that update variable node values and generate variable node to check node messages for variable node processing, and that perform check node constraint calculations and generate check node to variable node messages for check node processing.

Both V2C and C2V messages in this embodiment are vectors, each including a number of sub-messages with LLR values. Each V2C message vector from a particular variable node contains sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node. The check nodes calculate the minimum sub-message $min_1(d)$, the index idx (d) of $min_1(d)$, and the sub-minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, idx(d) and $min_2(d)$ is calculated based on the gathered sub-messages for that symbol d. For a Galois Field with q symbols, the check node will calculate the $min_1(d)$, idx(d) and $min_2(d)$ sub-message for each of the q−1 non-zero symbols in the field except the most likely symbol.

The V2C message vectors 412 from the variable node processor 402 are provided to a message format converter 414 which converts the format of V2C message vectors 412 to a format consisting of two parts, the most likely symbol, and the LLR of other symbols, normalized to the most likely symbol, yielding normalized V2C message vectors 416 in the second format. Message normalization in the message format converter 414 is performed with respect to the most likely symbol. Thus, the V2C and C2V vector format includes two parts, an identification of the most likely symbol and the LLR for the other q−1 symbols, since the most likely symbol has LLR equal to 0 after normalization. The normalized V2C message vectors 416 are provided to an edge interleaver 420 which shuffles messages on the boundaries at message edges, randomizing noise and breaking dependencies between messages. The interleaved normalized V2C message vectors 422 are provided to the check node processor 404, which generates C2V messages 424 for each neighboring variable node processor based on extrinsic V2C messages from other neighboring variable node processors.

The C2V messages 424 are provided to an edge de-interleaver 426, which reverses the process of the edge interleaver 420, and then to a format recovery circuit 430, which converts message vectors from the second, normalized format to the first message vector format of the variable node processor 402, reversing the process of the message format converter 414. The resulting first format C2V messages 432 are provided to the variable node processor 402 for use in updating perceived LLR values in variable nodes. In other embodiments, the variable node processor 402 is adapted to operate directly with message vectors of the second, normalized format. In these embodiments, the message format converter 414 and format recovery circuit 430 are omitted.

When the values in the LDPC decoder 400 converge and stabilize, or when a limit is reached on the number of local iterations, the variable node processor 402 provides the total LLR $S_n(a)$ 434 to a decision circuit 436 to generate a hard decision 440 based on the $argmin_a$ of the total LLR $S_n(a)$.

The check node processor 404 includes a hard decision and parity memory circuit 450 that processes the interleaved normalized V2C message vectors 422 to provide the most likely symbol 452 to a select and combine circuit 454 having a number of elementary computation units (ECUs). The check node processor 404 also includes a min finder 456 that calculates the $min_1(d)$, idx(d) and $min_2(d)$ sub-messages 460 for each of the q symbols in the Galois Field and stores them in a min memory 462. The stored $min_1(d)$, idx(d) and $min_2(d)$ sub-messages 464 are provided by min memory 462 to the select and combine circuit 454. The select and combine circuit 454 combines the $min_1(d)$, idx(d) and $min_2(d)$ sub-messages 464 and the most likely symbol 452 to generate the C2V messages 424.

The message vector format conversion performed by message format converter 414 on V2C message vectors 412 is reversed by format recovery circuit 430, providing C2V messages 432 to variable node processor 402 in the format used by the variable node processor 402.

A scheduler and offset/saturation circuit 470 in the LDPC decoder 400 controls the processing of the H matrix in the LDPC decoder 400, such as, but not limited to, controlling the order of C2V and V2C message generation, parity checks and variable node updates. The scheduler and offset/saturation circuit 400 also applies flexible saturation, limiting the LLR values in suspicious variable nodes. During decoding, the scheduler and offset/saturation circuit 470 compares the total LLR of selected variable nodes with the saturation level after the variable node is updated, and if the total LLR exceeds the saturation level, it is set at the saturation level. Again, the saturation levels for individual variable nodes may be different, and these saturation levels are adapted on the fly for specific variable nodes.

The scheduler and offset/saturation circuit 470 may also determine which variable nodes receive flexible saturation by identifying suspicious variable nodes, that is, variable nodes with relatively low column weights for which connected check nodes have failed parity checks for a certain number of iterations. In some embodiments with weight-2 and weight-3 columns in the H matrix, the scheduler and offset/saturation circuit 470 marks weight-2 variable nodes that have failing parity checks for a certain number of iterations as suspicious variable nodes. During decoding, the scheduler and offset/ saturation circuit 470 checks the total LLR values of the suspicious variable nodes after the variable node updates are performed, and resets the total LLR values to the saturation level for any total LLR values that exceed the saturation level.

By saturating or limiting the LLR values to maximum levels, the scheduler and offset/saturation circuit 470 prevents the variable node values from reaching higher levels which could hinder correction of erroneous values. This is particularly beneficial for low column weight variable nodes, for which the fewer connected check nodes provide less feedback than higher column weight variable nodes receive, because error correction is slower with less feedback.

The scheduler and offset/saturation circuit 470 also controls variable node offsetting, in which offsets are added to the variable node values or to V2C messages to facilitate convergence. In some embodiments, the scheduler and offset/saturation circuit 470 disables offsetting in variable nodes for which flexible saturation is applied.

In some embodiments, the saturation level is varied during different global iterations. The saturation level may be decreased as the global iteration index increases, making it increasingly easy to change a hard decision as decoding proceeds, or the saturation level may be increased as the global iteration index increases, so that it is easy to change a hard decision early in the decoding process but more difficult to change as decoding proceeds. The saturation levels may be determined in any suitable manner, such as during design time simulations to experimentally determine saturation levels that improve convergence for a particular LDPC decoder in expected channel conditions.

Figure 5:
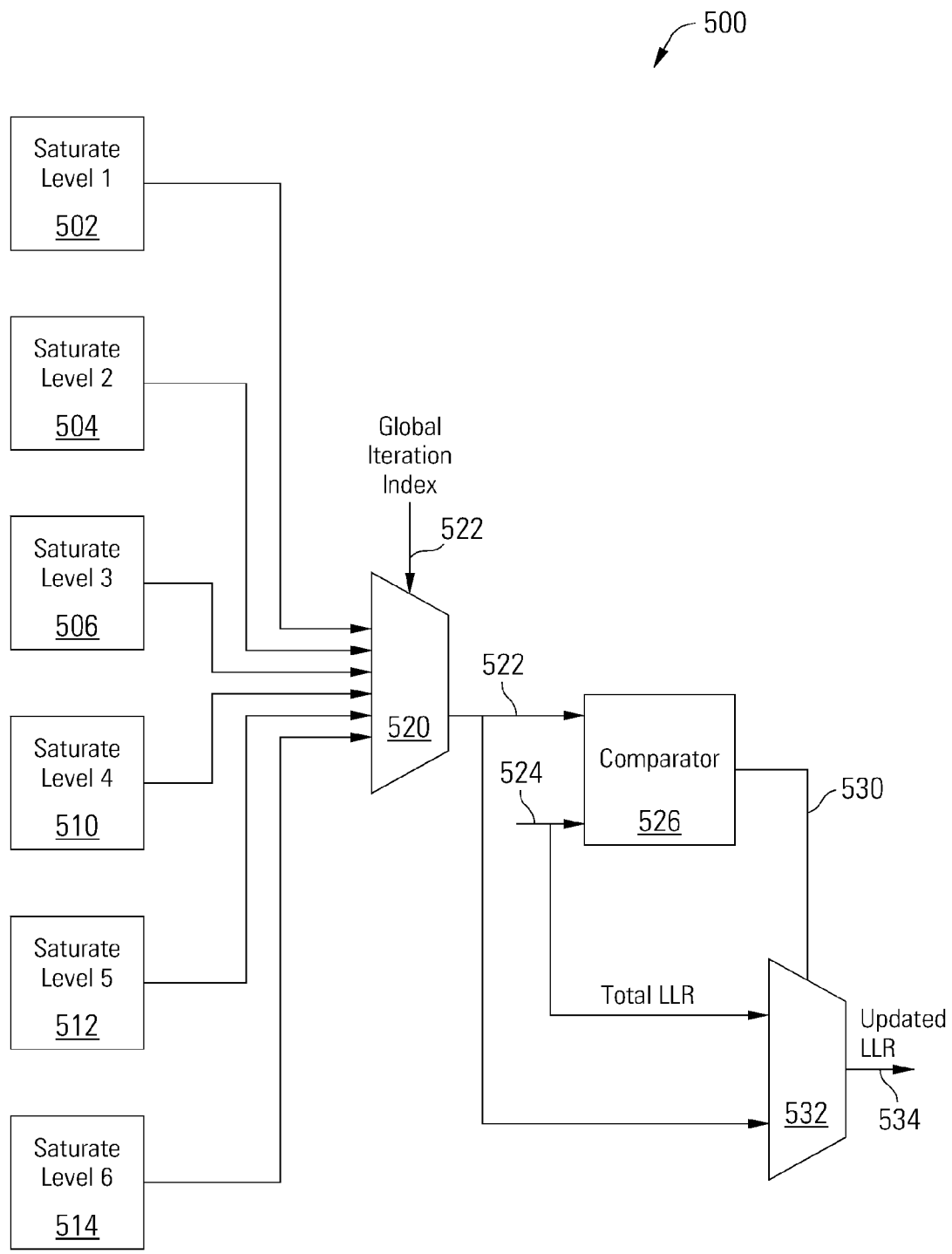
FIG. 5 depicts a flexible saturation circuit in accordance with some embodiments of the present inventions.

Turning to FIG. 5, a flexible saturation circuit 500 is depicted in accordance with some embodiments of the present inventions, that may be used in a scheduler and offset/saturation circuit 330, 470 to set the saturation level based on the global iteration number, to compare the total LLR for a variable node with the saturation level, and to limit the total LLR value to the saturation level. The flexible saturation circuit 500 includes, but is not limited to, six saturation level registers 502, 504, 506, 510, 512, 514, each containing a different saturation level value to be applied at different global iteration numbers or ranges of global iterations. A multiplexer 520 selects a saturation level 522 from one of the saturation level registers 502, 504, 506, 510, 512, 514 based on the global iteration index 522 that specifies the current global iteration number. A different saturation level 522 may be selected for each global iteration number, or each saturation level 522 may be applied in a range of global iteration numbers. A comparator 526 compares the saturation level 522 with the total LLR value 524 calculated for a variable node during a variable node update, in which the total LLR value=channel LLR (or previously calculated total LLR) plus the check node message values from the connected check nodes. A multiplexer 532 selects either the total LLR value 524 or the saturation level 522 based on the output 530 of the comparator 526, selecting the saturation level 522 if the total LLR value 524 exceeds the saturation level 522, and otherwise selecting the total LLR value 524 to produce the updated total LLR value 534. The flexible saturation circuit 500 is applied in some embodiments to the total LLR values for suspicious variable nodes, enabling them to be more easily corrected to prevent them from being stuck on erroneous values.

Figure 6:
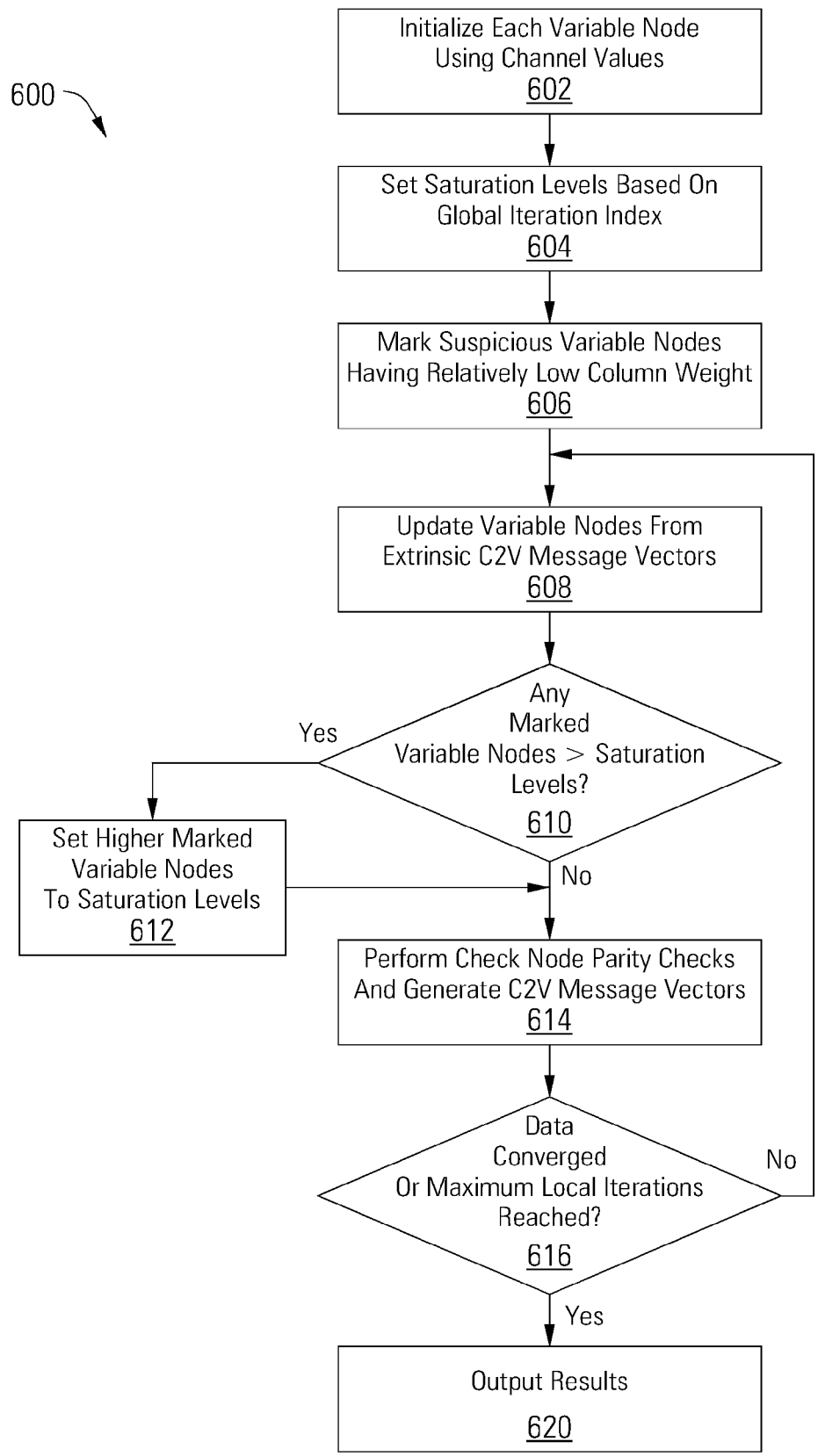
FIG. 6 depicts a flow diagram of an operation for decoding in an LDPC decoder with flexible saturation in accordance with some embodiments of the present inventions.

Turning to FIG. 6, a flow diagram 600 depicts an operation for decoding in an LDPC decoder with flexible saturation in accordance with some embodiments of the present inventions. Following flow diagram 600, variable nodes in the LDPC decoder are initialized using channel values. (Block 602) The channel values and variable node values may be, but are not limited to, LLR values or plain-likelihood probability values. Saturation levels to be applied are set based on the global iteration index. (Block 604) Suspicious variable nodes are marked. (Block 606) In some embodiments, variable nodes with lower column weights than other variable nodes in the H matrix are candidates for marking as suspicious, and of those candidates, those for which connected check nodes have failed one or more parity checks are marked as suspicious. Variable nodes are updated in the LDPC decoder based on check node messages in extrinsic C2V message vectors. (Block 608) A determination is made as to whether any of the marked variable nodes have probability values greater than the saturation level. (Block 610) If so, those variable nodes are set to the saturation level. (Block 612) For example, if the total LLR value is greater than the saturation level selected for the current global iteration is reset to the saturation level. Check node parity checks are performed and C2V message vectors are generated based on the variable node probability values. (Block 614) A determination is made as to whether data has converged or the limit on the maximum number of local iterations has been reached. If so, the results are output. (Block 620) Otherwise, decoding continues. (Block 608)

Figure 7:
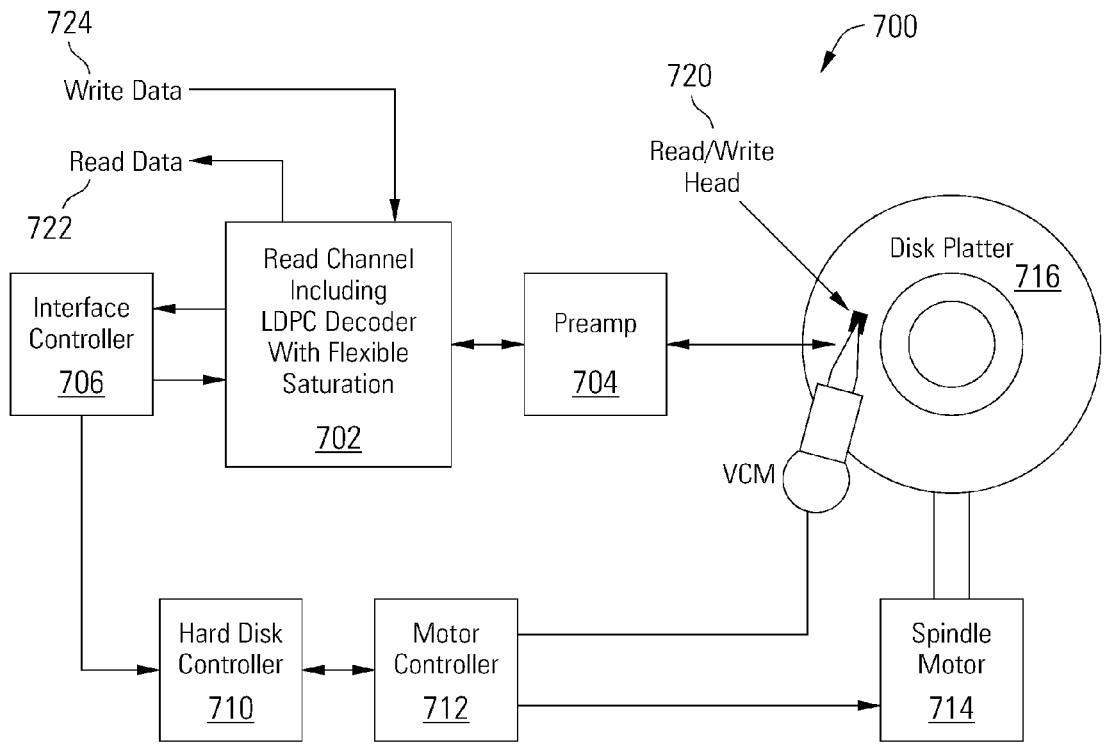
FIG. 7 depicts a storage system including a data processing circuit with an LDPC decoder with flexible saturation in accordance with some embodiments of the present inventions.

Turning to FIG. 7, a storage system 700 including a read channel circuit 702 having an LDPC decoder with flexible saturation is shown in accordance with some embodiments of the present inventions. Storage system 700 may be, for example, a hard disk drive. Storage system 700 also includes a preamplifier 704, an interface controller 706, a hard disk controller 710, a motor controller 712, a spindle motor 714, a disk platter 716, and a read/write head 720. Interface controller 706 controls addressing and timing of data to/from disk platter 716. The data on disk platter 716 consists of groups of magnetic signals that may be detected by read/write head assembly 720 when the assembly is properly positioned over disk platter 716. In one embodiment, disk platter 716 includes magnetic signals recorded in accordance with either a longitudinal or a perpendicular recording scheme.

In a typical read operation, read/write head assembly 720 is accurately positioned by motor controller 712 over a desired data track on disk platter 716. Motor controller 712 both positions read/write head assembly 720 in relation to disk platter 716 and drives spindle motor 714 by moving read/write head assembly to the proper data track on disk platter 716 under the direction of hard disk controller 710. Spindle motor 714 spins disk platter 716 at a determined spin rate (RPMs). Once read/write head assembly 720 is positioned adjacent the proper data track, magnetic signals representing data on disk platter 716 are sensed by read/write head assembly 720 as disk platter 716 is rotated by spindle motor 714. The sensed magnetic signals are provided as a continuous, minute analog signal representative of the magnetic data on disk platter 716. This minute analog signal is transferred from read/write head assembly 720 to read channel circuit 702 via preamplifier 704. Preamplifier 704 is operable to amplify the minute analog signals accessed from disk platter 716. In turn, read channel circuit 702 decodes and digitizes the received analog signal to recreate the information originally written to disk platter 716. This data is provided as read data 722 to a receiving circuit. As part of decoding the received information, read channel circuit 702 processes the received signal using an LDPC decoder with flexible saturation. Such an LDPC decoder with flexible saturation may be implemented consistent with that disclosed above in relation to FIGS. 1-5. In some cases, LDPC decoding with flexible saturation may be performed consistent with the flow diagram disclosed above in relation to FIG. 6. A write operation is substantially the opposite of the preceding read operation with write data 724 being provided to read channel circuit 702. This data is then encoded and written to disk platter 716. It should be noted that various functions or blocks of storage system 700 may be implemented in either software or firmware, while other functions or blocks are implemented in hardware.

Storage system 700 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 700, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 8:
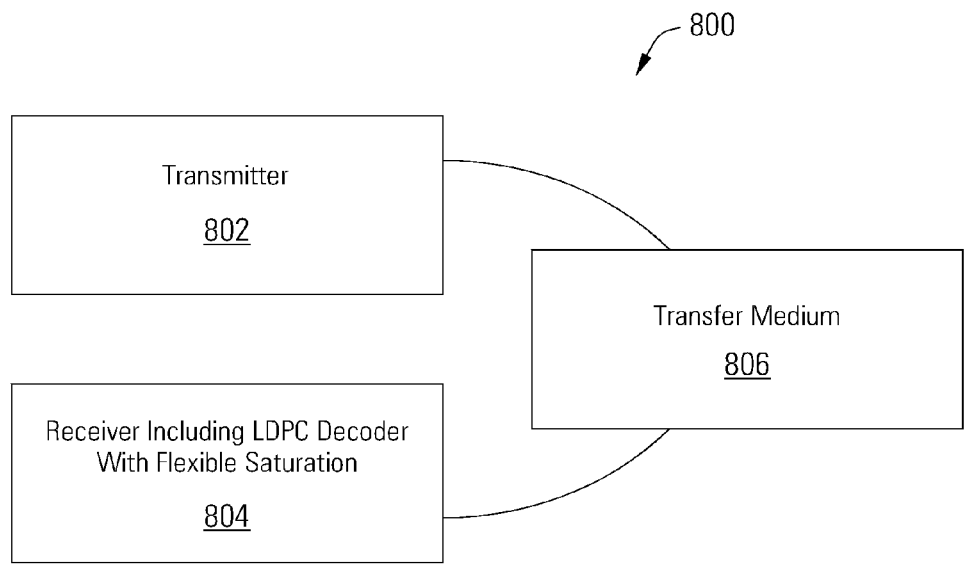
FIG. 8 depicts a wireless communication system including a data processing circuit with an LDPC decoder with flexible saturation in accordance with some embodiments of the present inventions.

Turning to FIG. 8, a data transmission system 800 including a receiver 804 having an LDPC decoder with flexible saturation is shown in accordance with various embodiments of the present invention. Data transmission system 800 includes a transmitter 802 that is operable to transmit encoded information via a transfer medium 806 as is known in the art. The encoded data is received from transfer medium 806 by a receiver 804. Receiver 804 processes the received input to yield the originally transmitted data. As part of processing the received information, receiver 804 decodes received data with an LDPC decoder with flexible saturation. Such an LDPC decoder with flexible saturation may be implemented consistent with that disclosed above in relation to FIGS. 1-5. In some cases, LDPC decoding with flexible saturation may be performed consistent with the flow diagram disclosed above in relation to FIG. 6.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present inventions provide novel systems, devices, methods and arrangements for an LDPC decoder with flexible saturation. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for processing data comprising:
a low density parity check decoder operable to generate decoded values for the data, comprising:
a variable node processor operable to generate variable node to check node messages and to calculate variable node values for a plurality of variable nodes in an H matrix based on check node to variable node messages;
a check node processor operable to generate the check node to variable node messages and to calculate checksums based on the variable node to check node messages; and
a saturation circuit operable to limit the variable node values of ones of the plurality of variable nodes that are marked as suspicious variable nodes.

2. The apparatus of claim 1, wherein the low density parity check code comprises an irregular low density parity check code.

3. The apparatus of claim 2, wherein the plurality of variable nodes comprise lower column weight variable nodes and higher column weight variable nodes, and wherein the suspicious variable nodes comprise ones of the lower column weight variable nodes likely to contain erroneous variable node values.

4. The apparatus of claim 3, wherein the lower column weight variable nodes likely to contain erroneous variable node values comprise variable nodes for which connected check nodes have failed a number of parity checks in successive iterations.

5. The apparatus of claim 1, wherein the saturation circuit is operable to limit log likelihood ratio values for the suspicious variable nodes to a saturation level.

6. The apparatus of claim 1, wherein the variable node processor and the check node processor are operable to perform min-sum based low density parity check decoding.

7. The apparatus of claim 1, wherein the saturation circuit is operable to compare the calculated variable node values to a saturation level and to replace ones of the calculated variable node values that exceed the saturation level with the saturation level.

8. The apparatus of claim 1, further comprising a data detector operable to generate detected values for input data, wherein the detected values comprise soft probabilities, and wherein the data detector and low density parity check decoder are operable to perform global iterations to process the data.

9. The apparatus of claim 8, wherein the saturation circuit is operable to limit the variable node values of the suspicious variable nodes to a plurality of saturation levels, and wherein the saturation circuit is operable to select from among the plurality of saturation levels based at least in part on a global iteration number.

10. The apparatus of claim 1, wherein the variable node processor is operable to perform variable node offsetting, and wherein the saturation circuit is operable to disable the variable node offsetting for at least the suspicious variable nodes.

11. The apparatus of claim 1, wherein the apparatus is implemented as an integrated circuit.

12. The apparatus of claim 1, wherein the apparatus is incorporated in a storage device.

13. The apparatus of claim 12, wherein the storage device comprises a redundant array of independent disks.

14. The apparatus of claim 1, wherein the apparatus is incorporated in a transmission system.

15. A method for processing data in a low density parity check decoder comprising:
   calculating variable node values for a plurality of variable nodes in an H matrix based on check node to variable node messages;
   limiting the variable node values of suspicious variable nodes to saturation levels;
   generating variable node to check node messages based on the variable node values;
   performing parity check calculations based on the variable node to check node messages; and
   calculating the check node to variable node messages.

16. The method of claim 15, further comprising identifying the suspicious variable nodes as variable nodes with low column weights in an irregular low density parity check decoder and which have connected check nodes with failing parity checks for a number of iterations.

17. The method of claim 15, wherein calculating the check node to variable node messages comprises performing min-sum based low density parity check decoding.

18. The method of claim 15, wherein calculating the variable node values comprises calculating log likelihood ratio values, and wherein limiting the variable node values comprises replacing the log likelihood ratio values with the saturation levels for those log likelihood ratio values that exceeded the saturation levels.

19. The method of claim 15, further comprising selecting the saturation levels based on a global iteration number.

20. A storage system comprising:
   a storage medium maintaining a data set;
   a read/write head assembly operable to sense the data set on the storage medium; and
   a low density parity check decoder operable to generate decoded values for the data set, comprising:
   a variable node processor operable to generate variable node to check node messages and to calculate variable node values for a plurality of variable nodes in an H matrix based on check node to variable node messages;
   a check node processor operable to generate the check node to variable node messages and to calculate checksums based on the variable node to check node messages; and
   a saturation circuit operable to limit the variable node values of ones of the plurality of variable nodes that are marked as suspicious variable nodes.

\* \* \* \* \*